(12) United States Patent
Ochi et al.

(10) Patent No.: US 10,384,417 B2
(45) Date of Patent: Aug. 20, 2019

(54) DEPOSITION MASK AND MANUFACTURING METHOD

(71) Applicant: Sharp Kabushiki Kaisha, Sakai, Osaka (JP)

(72) Inventors: Takashi Ochi, Sakai (JP); Shinichi Kawato, Sakai (JP); Kazuki Matsunaga, Sakai (JP); Yuhki Kobayashi, Sakai (JP); Katsuhiro Kikuchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 248 days.

(21) Appl. No.: 15/544,238

(22) PCT Filed: Jan. 19, 2016

(86) PCT No.: PCT/JP2016/051384
§ 371 (c)(1),
(2) Date: Jul. 17, 2017

(87) PCT Pub. No.: WO2016/117535
PCT Pub. Date: Jul. 28, 2016

(65) Prior Publication Data
US 2018/0009190 A1     Jan. 11, 2018

(30) Foreign Application Priority Data
Jan. 20, 2015   (JP) ................................ 2015-008801

(51) Int. Cl.
*C23C 14/04*   (2006.01)
*B32B 3/10*   (2006.01)
(Continued)

(52) U.S. Cl.
CPC ............... *B32B 3/10* (2013.01); *B05B 12/20* (2018.02); *B23K 26/362* (2013.01);
(Continued)

(58) Field of Classification Search
None
See application file for complete search history.

(56) References Cited

U.S. PATENT DOCUMENTS

2004/0202821 A1* 10/2004 Kim ..................... B32B 3/266
                                                    428/137
2015/0017759 A1   1/2015 Hirobe et al.

FOREIGN PATENT DOCUMENTS

JP   2005-154879 A   6/2005
JP   2013-124372 A   6/2013
(Continued)

OTHER PUBLICATIONS

English translation of JP2013165060.*

*Primary Examiner* — Charles Capozzi
(74) *Attorney, Agent, or Firm* — ScienBiziP, P.C.

(57) ABSTRACT

It comprises: a film made of a resin in which an aperture pattern is formed, the aperture pattern passing through the film, the aperture being with a shape and dimension corresponding to the thin-film pattern in a pre-established region for formation of the thin-film pattern on the substrate; and a metal member that has an aperture part opposite the aperture pattern with a shape and dimension larger than the aperture pattern, the metal member being provided as a thin sheet in intimate contact with one surface of the film on an outside part of the aperture pattern of the film. The film is mutually distanced and distributed, at a position where the film does not overlap the aperture pattern, into a plurality of divided parts on one surface of the metal member.

14 Claims, 9 Drawing Sheets

(51) Int. Cl.
    *C23C 14/24*     (2006.01)
    *B05B 12/20*     (2018.01)
    *B23K 26/362*     (2014.01)
    *B29C 35/08*     (2006.01)
    *B29C 65/18*     (2006.01)
    *B29C 65/00*     (2006.01)
    *B32B 7/02*     (2019.01)
    *B32B 15/08*     (2006.01)
    *B32B 27/28*     (2006.01)
    *B32B 37/06*     (2006.01)
    *H01L 51/00*     (2006.01)
    *B32B 38/04*     (2006.01)
    *B29K 79/00*     (2006.01)
    *B29L 7/00*     (2006.01)
    *B29L 9/00*     (2006.01)

(52) U.S. Cl.
CPC .......... *B29C 35/0805* (2013.01); *B29C 65/18* (2013.01); *B29C 66/742* (2013.01); *B32B 7/02* (2013.01); *B32B 15/08* (2013.01); *B32B 27/281* (2013.01); *B32B 37/06* (2013.01); *B32B 38/04* (2013.01); *C23C 14/042* (2013.01); *C23C 14/24* (2013.01); *H01L 51/001* (2013.01); *B29C 2035/0838* (2013.01); *B29K 2079/08* (2013.01); *B29K 2995/0012* (2013.01); *B29L 2007/00* (2013.01); *B29L 2009/003* (2013.01); *B32B 2307/30* (2013.01); *B32B 2310/0843* (2013.01); *B32B 2311/00* (2013.01); *B32B 2379/08* (2013.01); *B32B 2457/20* (2013.01); *H01L 51/0011* (2013.01)

(56) References Cited

FOREIGN PATENT DOCUMENTS

| | | |
|---|---|---|
| JP | 2013-165060 A | 8/2013 |
| JP | 2015-148003 A | 8/2015 |
| WO | 2013/039196 A1 | 3/2013 |

\* cited by examiner

DEPOSITION MASK AND MANUFACTURING METHOD

TECHNICAL FIELD

A number of aspects of the present invention relate to deposition mask and manufacturing method for forming a film with a plurality of thin-film patterns arranged with a fixed pitch on a substrate, and art suitable for use in manufacturing of an organic EL (electroluminescence) display device having a light-emitting layer formed by deposition.

The subject application claims priority based on the patent application No. 2015-008801 filed in Japan on Jan. 20, 2015, and incorporates by reference herein the content thereof.

BACKGROUND ART

As an organic EL display device (device) there is, for example, an active-matrix type having organic EL elements and, in this organic EL display device, thin-film organic EL elements are provided on a substrate provided with TFTs (thin-film transistors). In the organic EL elements, an organic EL layer, in which a light-emitting layer is included between a pair of electrodes, is laminated, a TFT being connected to one electrode of the pair of electrodes. A voltage is applied between the pair of electrodes to cause the light-emitting layer to emit light, thereby displaying an image.

In general, in a full-color organic EL display device, organic EL elements provided with light-emitting layers for each of the three colors red (R), green (G), and blue (B) are formed to be arranged as sub-pixels on a substrate. Using TFTs, these organic EL elements are selectively caused to emit light of a desired luminance, thereby making a color image display.

In manufacturing an organic EL display device, a light-emitting layer for each organic EL element made from organic light-emitting materials emitting in each color is formed in a prescribed pattern using vacuum deposition.

Vacuum deposition uses a mask (also called a shadow mask), in which a prescribed pattern of apertures are formed. The surface of a substrate onto which deposition is to be done, with which the mask is in intimate contact, is brought into opposition with a deposition source. By passing through apertures in the mask and by being deposited on the surface to receive the deposition, deposition particles (deposition material) from the deposition source form a covering film having a prescribed pattern. The deposition is performed for each color of light-emitting layer (called consecutive deposition).

A metal mask (fine metal mask: FMM) provided with highly precise apertures is used as the mask in depositing the different layers. When this is done, there is a case in which a multilayer mask, as shown in Patent Document 1, has been used.

Additionally, in order to accommodate the deposition of finer patterns, as shown in Patent Documents 2 and 3, the use of a deposition mask in which metal and resin or the like, rather than two metals, having different rates of thermal expansion, are laminated is known.

PRIOR ART DOCUMENTS

Patent Documents

[Patent Document 1] Japanese Patent Application Publication No. 2005-154879

[Patent Document 2] Japanese Patent Application Publication No. 2013-124372

[Patent Document 3] International Patent Publication No. 2013/039196

SUMMARY OF THE INVENTION

Problem to be Solved by the Invention

However, with the masks described in the patent documents, there is a problem that, because of the temperature rise during deposition, thermal expansion of the mask occurs, and thermal elongation causes positional offset and thickening of the deposited pattern.

It has been thought that, because a mask used in forming a film has a laminated structure with different coefficients of heat expansion between the layers of an Invar alloy and the polyimide, expansions of different magnitudes occur therebetween, thereby causing the mask to exhibit sagging and waviness and causing positional offset, and there has been a desire to solve this situation.

A number of aspects of the present invention are made in consideration of the above-noted situation and have as an object to provide a deposition mask and a manufacturing method for the deposition mask enabling deposition of a very fine pattern with good productivity, in which separately disposing a polyimide layer having a high coefficient of thermal expansion into each region in a deposition mask eliminates sagging and waviness caused by the difference in coefficients of thermal expansions and separating physically the layer of the mask having a high coefficient of thermal expansion in a position within the substrate plane controls the accumulated expansion so as not to exceed a certain value, thereby preventing the occurrence of positional offset.

Means for Solving the Problems

The problem is solved by a deposition mask according to one aspect of the present invention, the deposition mask comprising a plurality of layers, the deposition mask being for forming of a thin-film pattern of a certain shape on a substrate by deposition, the deposition mask comprising: a film in which an aperture pattern is formed, the aperture pattern passing through the film, the aperture being with a shape and dimension corresponding to the thin-film pattern in a pre-established region for formation of the thin-film pattern on the substrate; and a metal member that has an aperture part opposite the aperture pattern with a shape and dimension larger than the aperture pattern, the metal member being provided as a thin sheet in intimate contact with one surface of the film on an outside part of the aperture pattern of the film, wherein the film is mutually distanced and distributed into a plurality of divided parts on one surface of the metal member.

One aspect of the present invention can make a gap separating between the film divided extend an entire length of the metal member in a width direction.

One aspect of the present invention can make a separating gap separating between the film divided extend an entire length of the metal member in a vertical direction orthogonal to a width direction.

It is preferable for the film according to one aspect of the present invention to be multiply divided in correspondence to regions in which the plurality of thin-film patterns are formed as a group.

The film according to one aspect of the present invention can be multiply divided for each region for forming the thin-film patterns.

It is preferable that the substrate is a TFT substrate for an organic EL display and the thin-film pattern has organic EL layers for three colors.

In one aspect of the present invention, it is possible, in the gap between the film divided, for a film separated from the film divided to be provided.

The problem is solved by a manufacturing method for a deposition mask according to one aspect of the present invention, the deposition mask comprising a plurality of layers, the deposition mask being for forming of a thin-film pattern of a certain shape on a substrate by deposition, the deposition mask comprising a film in which an aperture pattern is formed, the aperture pattern passing through the film, the aperture being with a shape and dimensions corresponding to the thin-film pattern in a pre-established region for formation of the thin-film pattern on the substrate, and a metal member that has an aperture part opposite the aperture pattern with a shape and dimension larger than the aperture pattern, the metal member being provided as a thin sheet in intimate contact with one surface of the film on an outside part of the aperture pattern of the film, wherein the film is mutually distanced and distributed into a plurality of divided parts on one surface of the metal member, the manufacturing method comprising: a step of forming on a surface of a metal sheet to serve as the metal member a resin layer to serve as the film; a step of forming a plurality of the aperture parts that pass through the metal sheet; and a step of forming on the resin layer aperture patterns having shapes and dimensions smaller than the aperture parts and forming a separated film multiply and divided by removal of the resin layer so as to mutually distance and distribute them on one surface of the metal member.

In one aspect of the present invention, it is preferable that the formation of the aperture parts in the metal member is done from a surface of the metal sheet on a side opposite from the resin layer.

The formation of the aperture pattern in the resin layer according to one aspect of the present invention can be done from a surface of the metal sheet on the resin layer side.

It is preferable that the steps of forming the aperture pattern and forming the separated film according to one aspect of the present invention are performed using laser light radiation.

A deposition mask of one aspect of the present invention is a deposition mask made of a plurality of layers, for deposition forming of a thin-film pattern of a certain shape on a substrate, having a resin film in which a through aperture pattern is formed having a shape and dimensions corresponding to the thin-film pattern in a pre-established region for formation of the thin-film pattern on the substrate, and a metal member that has an aperture part opposite the aperture pattern with a shape and dimensions larger than the aperture pattern and that is provided as a thin sheet in intimate contact with one surface of the film on the outside part of the aperture pattern of the film, wherein by the film being mutually distanced and distributed into a plurality of divided parts on one surface of the metal member, in a multilayer deposition mask, even if the coefficient of thermal expansion of Invar, which is one example of a metal member, is approximately 1 ppm and the rate of thermal expansion of a polyimide, which is one example of a film, is approximately 30 ppm, although these are extremely small, because the rate of thermal expansion of the polyimide is approximately 30 times that of Invar, when viewed from both ends of the material, which are physically joined up until the end positions on both sides of the deposition mask, the accumulation of intraplanar expansion is too large to ignore. In one aspect of the present invention, however, by dividing a film made of a polyimide having a high coefficient of thermal expansion into prescribed separate regions and isolating each region, in the gap part between the separated films, the expansion of the film, which has a large coefficient of thermal expansion, can be absorbed. By doing this, in a deposition mask made of a plurality of layers, by physically separating a layer that has a large coefficient of thermal expansion, the accumulation of expansion is controlled and suppressed so as not to exceed a certain value, thereby enabling a solution to the sagging and waviness that had been caused by the difference in coefficients of thermal expansion. It is preferable that the film be made of resin.

In one aspect of the present invention, the gap separating between the divided films extends the entire length of the width direction of the metal member and/or the gap separating between the divided films extends the entire length in the vertical direction, which is orthogonal to the width direction, of the metal member. Thus, by providing a gap part between divided films across the entire length in a direction within the plane of the metal member, in the gap having the metal member but no film, the film expansion is absorbed, thereby reducing the effect of thermal deformation and the like in the aperture pattern part and preventing the occurrence of pattern thickening, whereby the thin-film pattern width dimension increases, and the occurrence positional offset.

In one aspect of the present invention, the film is multiply divided in correspondence to regions in which the plurality of thin-film patterns are formed as a group. Thus, the film is divided into regions that each correspond to an organic EL panel (organic EL display device) to be manufactured as a thin-film pattern, thereby eliminating the sagging and waviness caused by the difference in coefficients of thermal expansion.

In one aspect of the present invention, the film is multiply divided for each region for forming the thin-film patterns. Thus, the film is divided into regions corresponding to thin-film patterns to be formed, thereby eliminating the sagging and waviness occurring by the difference in coefficients of thermal expansion and enabling the manufacture of an organic EL panel or the like by forming a finer thin-film pattern.

In one aspect of the present invention, means in which the metal member is either a magnetic material or a non-magnetic material, or means wherein the magnetic material is Invar or an Invar alloy, means in which, in the aperture pattern, the aperture surface area on the one surface side of the film is the same as the surface area of the thin-film pattern and the aperture surface area on the other surface side on the opposite side from the one surface is larger than the aperture surface area on the one surface side, means in which the metal member provided on the one surface side of the film is used in intimate contact with the substrate, and means in which the film is a polyimide may be used.

The deposition mask of one aspect of the present invention may be used when performing co-deposition that is multi-source deposition in the deposition step by scanned deposition.

In one aspect of the present invention, by providing in the gap between the divided films separated from the divided films, stress relaxation is maintained, while increasing the rigidity of the metal member.

In one aspect of the present invention, a manufacturing method for a deposition mask made of a plurality of layers, for forming a thin-film pattern of a certain shape on a substrate by deposition, has a film in which a through aperture pattern is formed having shapes and dimensions corresponding to the thin-film pattern in a pre-established region for formation of the thin-film patterns, a metal member that has an aperture part opposite the aperture pattern with a shape and dimensions larger than the aperture pattern and that is provided as a thin sheet in intimate contact with one surface of the film on the outside part of the aperture pattern of the film. The method has a step of forming on a surface of a metal sheet to serve as the metal member a resin layer to serve as the film, a step of forming a plurality of the aperture parts that pass through the metal sheet, and a step of forming on the resin layer aperture patterns having shapes and dimensions smaller than the aperture parts and forming a separated film multiply divided by removal of the resin layer so as to distance and mutually separate and divide them on one surface of the metal member. This enables absorption of the expansion of the film, which has a large rate of thermal expansion in the gap provided between the separated films. Even if the coefficient of thermal expansion of Invar, which is one example of a metal member, is approximately 1 ppm and the rate of thermal expansion of a polyimide, which is one example of a film, is approximately 30 ppm, although these are extremely small, because the rate of thermal expansion of the polyimide is approximately 30 times that of Invar, when viewed from both ends of the material, which are physically joined up until the end positions on both sides of the deposition mask, the accumulation of intraplanar expansion is too large to ignore. In one aspect of the present invention, however, by dividing a film made of a polyimide having a high coefficient of thermal expansion into prescribed separate regions and isolating each region, in the gap part between the separated films, the expansion of the film, which has a large coefficient of thermal expansion, can be absorbed. By doing this, in a deposition mask made of a plurality of layers, by physically separating a layer that has a large coefficient of thermal expansion, the accumulation of expansion is controlled and suppressed so as not to exceed a certain value, thereby enabling elimination of the sagging and waviness that had been caused by the difference in coefficients of thermal expansion.

In one aspect of the present invention, the deposition mask can be manufactured by forming the aperture parts in the metal member from the surface on the opposite side of the metal sheet from the resin layer.

In one aspect of the present invention, the deposition mask can be manufactured by performing the step of forming the aperture patterns in the resin layer from the surface of the metal sheet on the resin layer side.

In one aspect of the present invention, the deposition mask can be manufactured by forming the aperture pattern and forming the separated film using laser light radiation.

Effect of the Invention

According to a number of aspects of the present invention, a deposition mask and a manufacturing method for a deposition can be provided that solve the sagging and waviness that had been caused by the difference in coefficients of thermal expansion between different layers in the deposition mask and perform control so that the accumulated expansion does not exceed a certain value, thereby preventing the occurrence of positional offset and enabling deposition of a very fine pattern with good reproducibility.

EMBODIMENTS FOR CARRYING OUT THE INVENTION

The first embodiment of a deposition mask and a manufacturing method according to a number of aspects of the present invention will now be described, with references made to drawings.

Figure 1A:
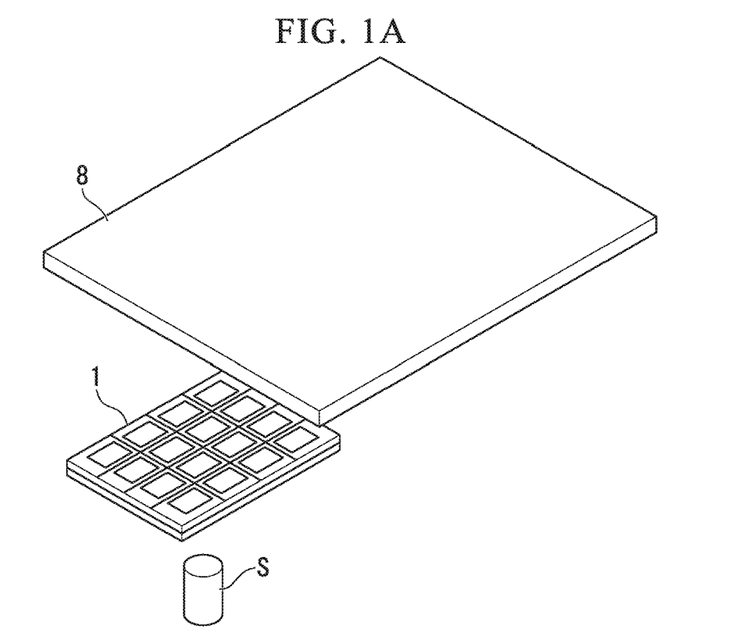
FIG. 1A is an oblique view showing a first embodiment of a deposition mask according to one aspect of the present invention during deposition.
Figure 1B:
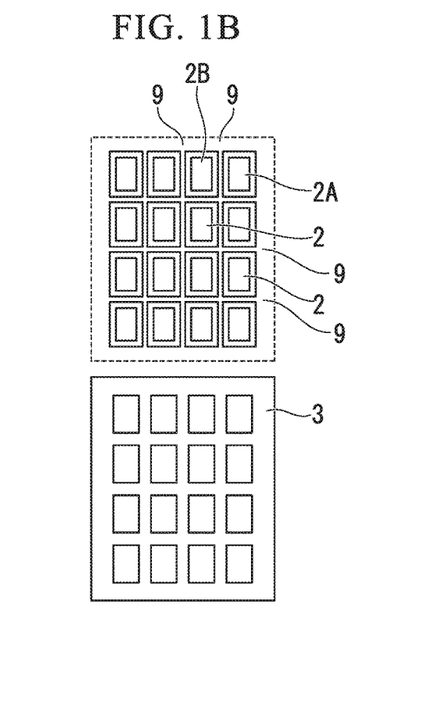
FIG. 1B is an exploded plan view showing the first embodiment of a deposition mask according to one aspect of the present invention, which the opposition is shown.

FIG. 1A and FIG. 1B are oblique views showing deposition processing by the deposition mask in the present embodiment, in which the reference symbol 1 represents the deposition mask.

The deposition mask 1 according to the present embodiment, as shown in FIG. 1A and FIG. 1B, is for forming organic EL elements by forming, from a deposition source S, a film with a plurality of thin-film patterns 8a arranged with a constant arrangement pitch on a substrate 8, and has a film 2 and a metal member 3.

The metal member 3 that uses Invar is provided on the deposition source S side of the deposition mask 1, and a film 2 using a polyimide (PI) is provided on the substrate 8 side. Lamination and adhering are done so that the film 2 and the metal member 3 are in mutual intimate contact.

Figure 2A:
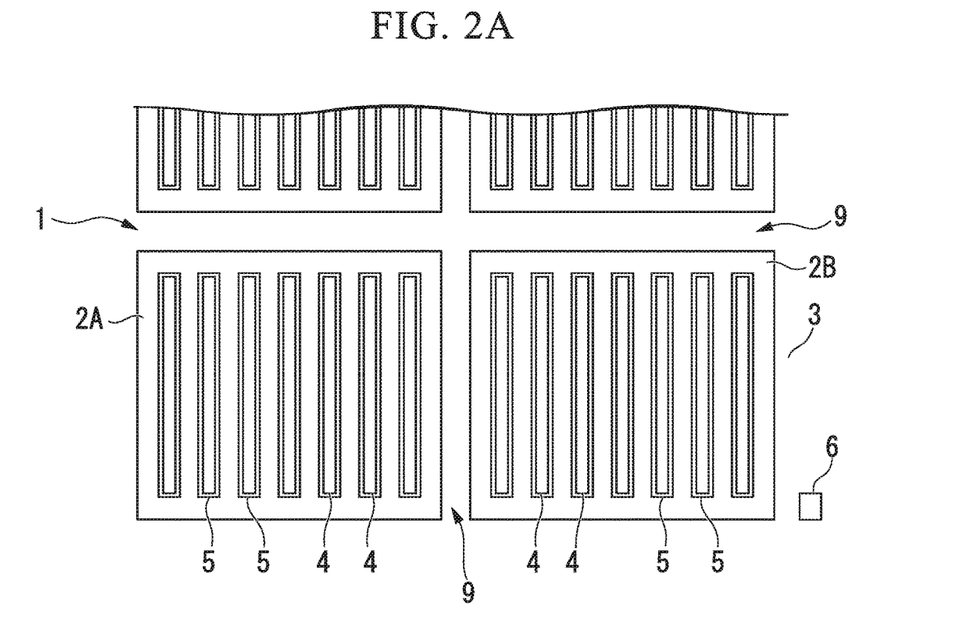
FIG. 2A is a plan view showing the first embodiment of a deposition mask according to one aspect of the present invention.
Figure 2B:
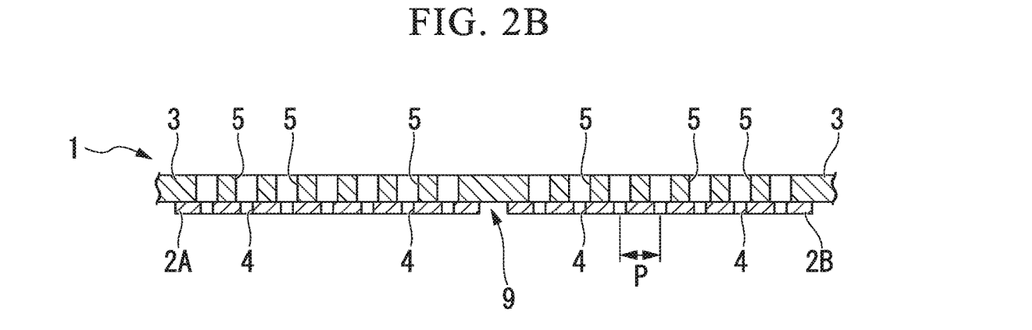
FIG. 2B is a cross-sectional view showing the first embodiment of a deposition mask according to one aspect of the present invention.

On the film 2, as shown in FIG. 2B, are formed a plurality of long, narrow aperture patterns 4, such as shown in FIG. 2A, for example, having dimensions and shapes that correspond to the thin-film patterns, arranged with an arrangement pitch P corresponding to the arrangement pitch of the plurality of thin-film patterns 8a on the substrate. The film 2 is made of a resin, such as a polyimide or polyethylene terephthalate (PET) having a thickness of, for example, approximately 1 μm to 30 μm, and preferably it is desirable that the film 2 have a coefficient of thermal expansion as close as possible to that of the metal member 3, to be described later. If the coefficient of thermal expansion of the film 2 is anisotropic, it is desirable that the direction in which the coefficient of thermal expansion of the film 2 is large is caused to coincide with the longitudinal direction of stripe-shaped through apertures 5 formed in the metal member 3.

Although the patterns 4 are long, narrow lines in the present embodiment, there is no particular need for them to be line-shaped, and film 2 may be provided with a plurality of pixel apertures on Invar (metal member) 3 provided with line-shaped apertures.

The metal member 3 holds and reinforces the film 2 and, as shown in FIG. 1A, FIG. 1B, FIG. 2A, and FIG. 2B, is made of a magnetic metal sheet provided with a plurality of long, narrow through apertures (aperture parts) 5 that have dimensions and shapes larger than the aperture patterns 4 and are opposite the aperture patterns 4. The metal has a coefficient of thermal expansion of less than $6\times10^{-6}/°$ C., which is smaller than the coefficient of thermal expansion of a general metal ($6\times10^{-6}/°$ C. to $20\times 10^{-6}/°$ C.). Preferably, it is desirable that the metal member 3 be Invar, which has a coefficient of thermal expansion of $2\times10^{-6}/°$ C. or less or super Invar, which has a coefficient of thermal expansion of $1\times 10^{-6}/°$ C. or less.

The film 2, as shown in FIG. 1A, FIG. 1B, FIG. 2A, and FIG. 2B, is multiply divided vertically and horizontally with respect to the metal member 3. FIG. 2A and FIG. 2B show as an example the extracted area around two locations thereof.

The outlines of both of the divided films 2A and 2B are established so that they are regions corresponding to the screen size of an organic EL panels (organic EL display devices) to be manufactured, and a gap 9 is provided between the divided films 2A and 2B so as to expose the metal member 3. The drawing shows gaps 9 in the vertical direction and in the horizontal direction, and these are formed in the same manner on the outside of the illustrated range. The dimensions of the vertical and horizontal gaps 9 may be established to be either the same or different.

It is sufficient that the width dimension of the gap 9 be set to a size with which the divided films 2A and 2B do not make contact with each other when the divided films 2A and 2B are heated and expand during deposition processing, and sufficiently wide that they do not affect the aperture patterns 4 in manufacturing the organic EL panels. A smaller value than this range is not preferable, because the divided films 2A and 2B are heated and expand in deposition processing, coming into mutual contact, and the gaps 9 do not absorb the effect of the thermal expansion, and a larger value than this range is not preferable, because of either affecting neighboring apertures patterns 4 or increasing the cost of manufacturing the organic EL panels.

The width dimensions of the gaps 9 are therefore set in accordance with the vertical and horizontal dimensions of the divided films 2A and 2B. The width dimension of the gaps 9 may be made uniform over their entire lengths, or may be made to differ, in accordance with the disposition location.

The gaps 9 are formed to extend over the full length in the vertical direction and the horizontal direction in the metal member 3. This absorbs the difference between the rates of thermal expansion of the film 2 and the metal member 3 over the entire region of the metal member 3, enabling reduction and prevention of distortion deformation caused by heat.

The reference symbol 6 in FIG. 2A represents a mask-side alignment mark for positioning the deposition mask 1 with respect to the substrate, and is, for example, a square through window formed in the metal member 3.

Although the description of the present embodiment is for the case in which the aperture patterns 4 and the through apertures 5 have long, narrow shapes, this constitution is not a restriction, and the aperture patterns 4 and the through apertures 5 may be separated into a plurality of small units by long, narrow bridges.

Additionally, the metal member 3 may be formed to have a thickness that is greater at the edge parts than at the center part in which the through apertures 5 are formed.

Next, a method for manufacturing the deposition mask 1 of one aspect of the present invention will be described.

The first step is to prepare a metal sheet that will serve as the metal member 3, made of a magnetic metal sheet (for example, Invar) having at least the same surface area as the substrate, a thickness of 10 μm to 50 μm, and a coefficient of thermal expansion of less than $6\times10^{-6}/°$ C.

Next, for example, a resin such as a polyimide is coated over the surface of the metal sheet to form a resin layer that will serve as the film 2 over the entire surface, with a thickness of approximately 1 μm to 15 μm.

In forming the resin layer, processing may be done to make an intimate contact between the metal sheet and the resin layer.

In this case, intimate contact includes a method of pressing a film resin and the metal sheet together, a method of adhering a film resin to the metal sheet, a method of pressing a half-dried resin solution onto the metal sheet, and a method of coating a resin solution onto the metal sheet.

In detail, methods of pressing a film resin and the metal sheet together include a method of hot-pressing a thermoplastic film or film that has a surface subjected to fusion processing and a metal sheet together, and a method of reforming the surface of a resin film and hot-pressing the resin film and a metal sheet together. In this case, if the surface of the film is reformed by forming thereon carboxyl groups (—COOH), carbonyl groups (—COO), or the like, adhesion can be done by the chemical bonding occurring at the boundary with the metal sheet. The surface of the film may also be reformed by processing in an atmospheric pressure plasma or a reduced-pressure plasma, or by wet etching or the like of the film surface in an alkaline solution.

Methods of pressing a film resin and a metal sheet together include interposing a setting resin that contains no solvent or only contains a very small amount of solvent between a resin film and a metal sheet to adhere them by the setting resin. This includes, for example, using a film having edge regions coated with a metal film and performing flux-free soldering of the film and the metal sheet using flux-free solder coated onto the metal film.

Next, in the second step, a plurality of through apertures 5 that have dimensions and shapes larger than the aperture parts 4 to be formed in the film 2 are formed in the metal sheet with an arrangement pitch P the same as the arrangement pitch P of the aperture patterns 4, using, for example, laser machining or etching. The machining formation of these through apertures 5 is preferably done from the surface on the side of the metal film opposite from the resin layer.

Then, in the third step, the aperture patterns 4 to be formed in the resin layer sheet are formed with an arrangement pitch P that is the same as the arrangement pitch P of the through apertures 5, using, for example, laser machining. The resin layer is removed in the parts corresponding to the gaps 9 so as to separate the film 2, thereby forming the divided films 2A and 2B having a surface area that is smaller than the metal member 3. The machining formation of the aperture patterns 4 is preferably done from the resin layer side of the metal sheet.

The forming of the aperture patterns 4 and the divided films 2A and 2B is done using, for example, an excimer laser with a wavelength of shorter than 400 nm, for example, a 248-nm KrF excimer laser, radiating a laser light L having an energy density of 0.1 J/cm$^2$ to 20 J/cm$^2$, the through aperture patterns 4 being formed with dimensions and shapes corresponding to the thin-film patterns 8a by ablation of the film 2.

In this case, a beam expander expands the diameter of the laser light L radiated onto the film 2 and, after being made uniform light by illumination optics, the light is converted to a linear beam by a cylindrical lens. When this is done, a photomask can be provided with a long, narrow aperture on the light incidence side of the cylindrical lens, the cylindrical lens projecting a reduction of the photomask aperture onto the film 2, adjusted to a reference pattern on a reference substrate.

The forming of the aperture patterns 4 in the film 2 by the laser light L can be done in the following manner. Specifically, the film 2 is transported in the direction of arrangement of the reference pattern at a constant speed as the reference pattern is imaged by an imaging means disposed to enable imaging of a position a certain distance from the front side of the transport direction with respect to the position of radiation of the laser light L, thereby enabling radiation of the laser light L each time the film 2 moves by a pre-established distance after the reference pattern is detected.

When this is done, the film 2 is machined so that one end of the center line of the aperture patterns 4 coincides, within an allowable tolerance range, with the center line of the through aperture 5, which is the corresponding position, and so that there is mutual line symmetry therebetween. Simultaneously, the outline shapes and dimensions of the through apertures 5 formed in the metal member 3 are also corrected by laser machining or the like so that they are within a prescribed dimensional accuracy.

Simultaneously, the mask-side alignment mark for positioning with respect to the substrate-side alignment mark (not shown) formed on the reference substrate 8 is formed, thereby completing the deposition mask 1.

Next, a method of manufacturing an organic EL display device by using the deposition mask 1 according to one aspect of the present invention to form a R (red) organic EL layer, a G (green) organic EL layer, and a B (blue) organic EL layer on a TFT substrate as a plurality of types of thin-film patterns having a certain shape will be described.

Figure 9:
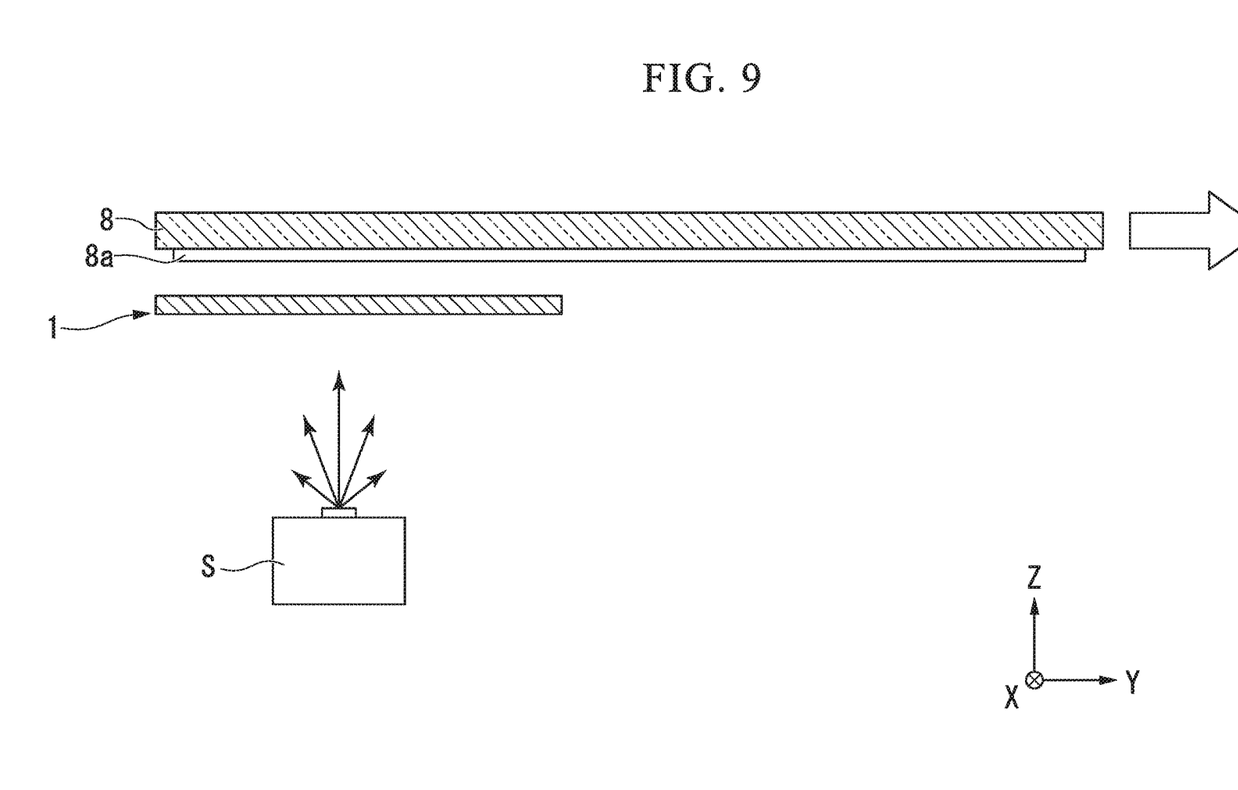
FIG. 9 is a schematic representation of scanned deposition.

In the deposition processing of the present embodiment, as shown in FIG. 9, a deposition mask 1 that is smaller than the substrate on which a film is to be formed (substrate) is used to perform deposition as the substrate 8 and the deposition mask 1 and deposition source S are relatively scanned, to perform deposition (scanned deposition) using the scanning method. In the present embodiment, the description will be with the scanning direction and a direction parallel to the scanning direction (first direction) taken as the Y direction (Y-axis direction), a direction perpendicular to the scanning direction (second direction) taken as the X direction (X-axis direction), and the axis of a normal line with respect to the substrate, which is perpendicular to both the X axis and the Y axis, taken as the Z axis (Z-axis direction). As a convenience in the description, the side of the arrow in the Z-axis direction will be referred to as the upper side. In FIG. 9, the deposition mask 1 is shown in simplified form.

A deposition apparatus performing deposition processing in the present embodiment has a deposition unit that includes a vacuum chamber (film forming chamber), a substrate holder as a substrate metal member that holds the substrate 8 on which deposition is to be done, a substrate transport mechanism (transport mechanism) that transports the substrate 8 on which deposition is to be done, and a deposition source S, a deposition unit that includes the deposition sources S, an alignment observation means with image sensors and the like, and a control circuit and the like.

The deposition source S and the deposition mask 1 constitute the deposition unit. The substrate 8 moves relative to the deposition mask 1 at a constant speed along the substrate surface on the side opposite from the deposition source S.

Although it is not illustrated, the deposition sources S correspond to the colors RGB. A deposition source S has a deposition aperture on the upper surface thereof (that is, the surface facing the deposition mask 1). The deposition aperture has the shape of a nozzle opening upwardly and parallel to the Z-axis.

The deposition apertures release vapors of a plurality of materials (for example, first to third deposition particles) corresponding to the materials of the light-emitting layers. For example, a host vapor (first deposition particles) of the light-emitting layer can be released from the first deposition aperture of the first deposition source, an assist vapor (second deposition particles) can be released from the second deposition aperture of the second deposition source, and a dopant vapor (third deposition particles) can be released from the third deposition aperture of the third deposition source.

The deposition mask 1 is a sheet having a main surface (the surface having the maximum surface area) that is parallel to the XY plane and is formed to have a plurality of aperture patterns 4 formed intermittently at different positions along the X-axis direction. The aperture patterns 4 are through holes passing through the deposition mask 1 in the Z-axis direction. Although the shapes of the aperture patterns 4 in the present embodiment are slot shapes parallel to the Y axis, this is not a restriction to the present invention. The shapes and dimensions of all of the mask apertures may be the same or may be different. The X-axis direction pitch P of the aperture patterns 4 may be uniform or may differ.

The plurality of deposition sources S are distanced from the deposition mask 1 in the Z-axis direction. The relative positions of the deposition sources S and the deposition mask 1 are preferably substantially constant at least during the period in which consecutive deposition in done.

The substrate 8 is held by a holding device. For example, an electrostatic chuck, which uses electrostatic force to hold the substrate 8 from the side thereof opposite from the surface on which deposition is done, can be used as the holding device. This enables the substrate 8 to be held in a state in which it substantially does not sag by its own weight. The holding device that holds the substrate 8, however, is not restricted to being an electrostatic chuck and may be another device.

The substrate 8 held by the holding device is scanned (moved) by transport in parallel with the Y axis by the transport mechanism at a constant speed with respect to the deposition mask 1, on the side thereof opposite from the deposition source S, in the condition in which there is a certain constant distance from the deposition mask 1. The movement of the substrate 8 may be reciprocating movement or, alternatively, may be a single-direction movement in only one of the directions. The constitution of the transport mechanism is not particularly restricted. For example, it can be a feed-screw mechanism in which a feed screw is rotated by a motor, a linear motor or the like, or may be a known transport drive mechanism.

The above-noted deposition unit, substrate 8, holding device, and transport mechanism are housed in the vacuum chamber. The vacuum chamber is a hermetically sealed container, the internal space thereof being reduced to and maintained at a prescribed low-pressure state.

The first to third deposition particles pass through the through apertures 5 and the aperture patterns 4 of the deposition mask 1. Having passed through the through apertures 5 and the aperture patterns 4, the first to third deposition particles become attached to the surface of the substrate 8 on which they are to be deposited, which is scanned in the Y-axis direction (that is, attached to the surface on the side of the substrate 8 that faces the deposition mask 1) and form a covering film in which the first to third deposition particles are mixed. The covering film is stripe-shaped, extending more than the aperture pattern 4 in the Y-axis direction. As described above, if the material of the first deposition particles is a host, the materials of the second deposition particles is an assist material, and the material of the third deposition particles is a dopant, a covering film can be formed that includes a dopant dispersed in a host.

If one or more of the materials of the separate first to third deposition particles for each of the colors red, green, and blue is changed and deposition is done three times (by consecutive deposition), stripe-shaped covering films (that is, a light-emitting layers) can be formed that correspond to each of the colors red, green, and blue on the surface of the substrate 8 onto which deposition is to be done.

In this manner, organic EL layers are formed by successively forming films, so that the laminated structure on the TFT substrate is one of a positive hole injection layer, a positive hole transport layer, a light-emitting layer, and an electron transport layer and the like, a transparent electrically conductive film of ITO (indium tin oxide) being formed by known art on each organic EL layer (R, G, and B) of the TFT substrate, and additionally a transparent protective substrate being formed thereover, thereby manufacturing an organic EL display device.

The second embodiment of a deposition mask according to one aspect of the present invention will now be described, with references made to the drawings.

Figure 3A:
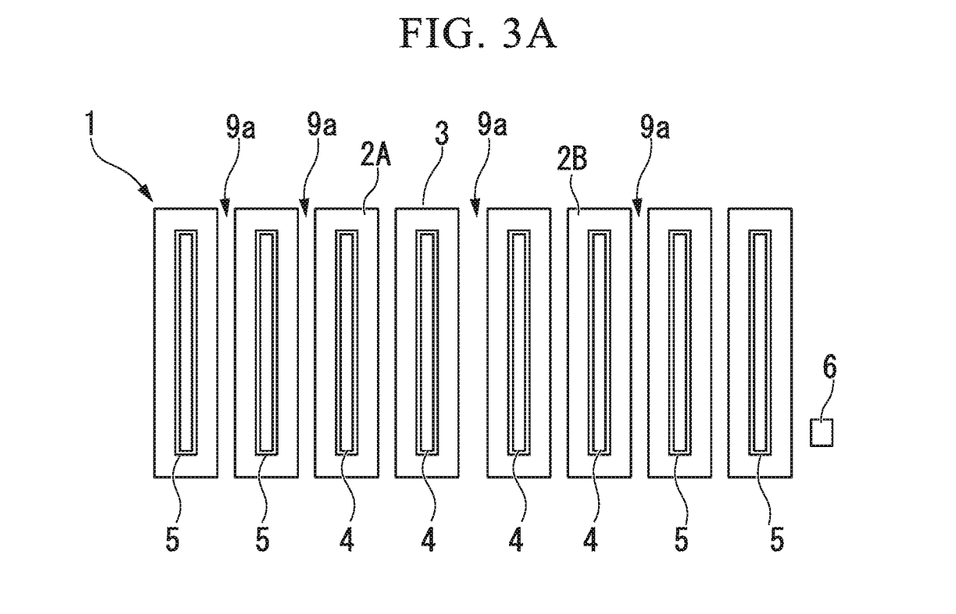
FIG. 3A is a plan view showing a second embodiment of a deposition mask according to one aspect of the present invention.
Figure 3B:
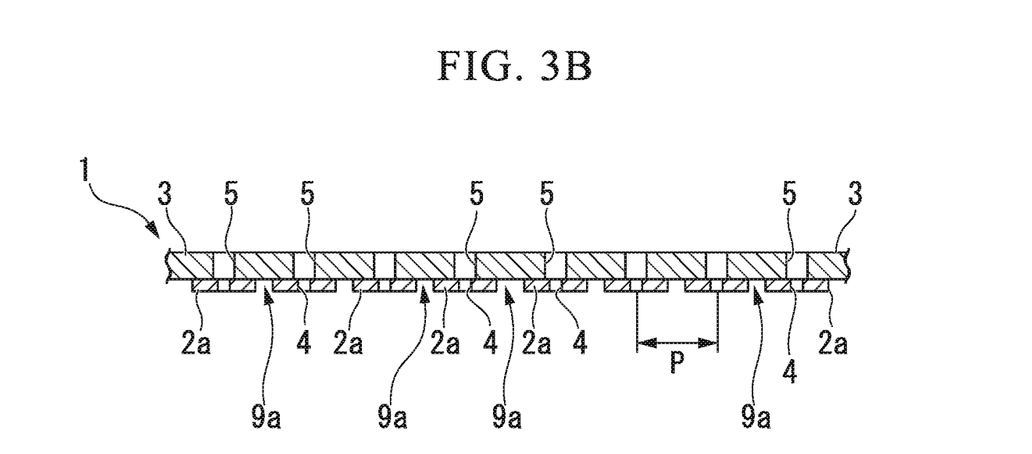
FIG. 3B is a cross-sectional view showing the second embodiment of a deposition mask according to one aspect of the present invention.

FIG. 3A and FIG. 3B are plan views showing the divided films of a deposition mask in the present embodiment.

In the present embodiment, the difference from the first embodiment described above is the planar shape of the divided films, and constituent elements other than that are assigned the same reference symbols and the descriptions thereof will be omitted.

In the present embodiment, the divided films 2a and 2b have planar shapes divided for each aperture pattern 4, which are long, narrow rectangular shapes. That is, between aperture patterns 4, 4, as shown in FIG. 3A and FIG. 3B, a gap 9a is formed between the divided films 2a, 2a. In these drawings, parts at the top and bottom positions in the vertical direction are not shown.

The film 2 of the present embodiment, as shown in FIG. 1A and FIG. 1B, is multiply divided vertically and horizontally with respect to the metal member 3. FIG. 2A and FIG. 2B show by example, the part corresponding to organic EL panels in two locations.

Both of the divided films 2a, 2, in a region corresponding to an organic EL panel to be manufactured, have outlines that are established as shapes that correspond to the outlines of the aperture patterns 4 and the through apertures 5, and gaps 9a, 9a are provided between the divided films 2a, 2a, so as to expose the metal member 3. Although the drawings show only the gaps 9a, 9a extending vertically are shown, the same type of gaps are formed at upper and lower positions within the range illustrated. The dimensions of the vertical and horizontal gaps 9a, 9a may be established to be either the same or different.

It is sufficient that the width dimensions of the gaps 9a, 9a be established as a size with which the divided films 2a, 2a do not make contact with each other when they are heated and expand during deposition processing, and sufficiently wide that they do not affect the aperture patterns 4 in manufacturing the organic EL panels. A smaller value than this range is not preferable, because the divided films 2a, 2a are heated and expand in deposition processing, coming into mutual contact, and the effect of the thermal expansion cannot be absorbed by the gaps 9, and a larger value than this range is not preferable, because of either affecting neighboring apertures patterns 4 or increasing the cost of manufacturing the organic EL panels.

In the present embodiment, because fine division is done to divide the divided films 2a, 2a so that the gaps 9a, 9a are formed for each aperture pattern 4, there is a further reduction of the effect of thermal expansion of the film. Additionally, because the divided films 2a, 2a are formed to have outlines corresponding to each of the aperture patterns 4, even if the shapes of the aperture patterns 4 are different, they can sufficiently track and accommodate the thermal expansion. It is therefore possible to perform precise deposition processing to accommodate a finer thin-film pattern 8a.

The third embodiment of a deposition mask according to an aspect of the present invention will now be described, with references to the drawings.

Figure 8:
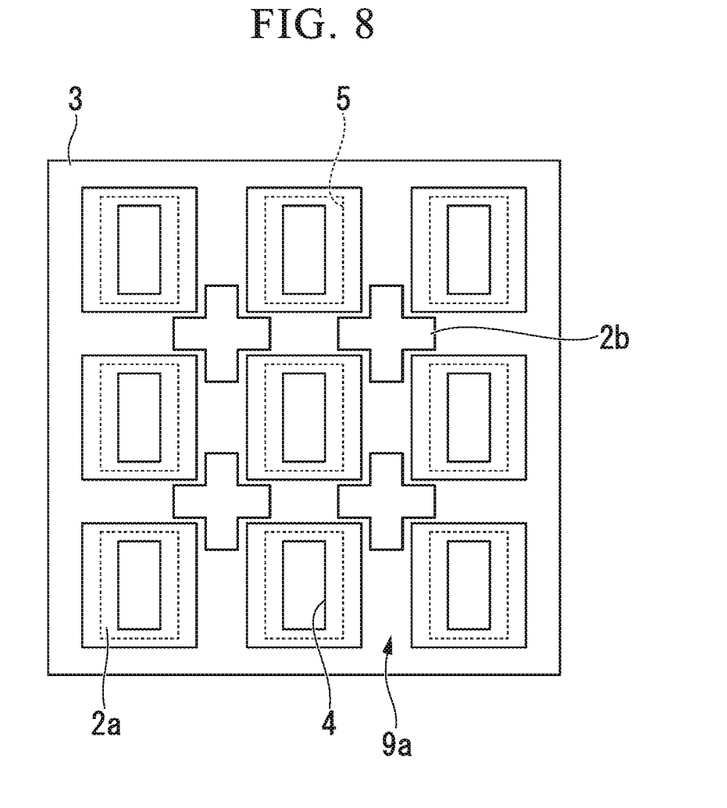
FIG. 8 is a plan view showing a third embodiment of a deposition mask in one aspect of the present invention.

In the present embodiment, films (ribs) 2b, 2b are formed, as shown in FIG. 8, in the gap 9a between the divided films 2a, 2a. In this drawing, parts at the top and bottom positions in the vertical direction are not shown. The films (ribs) 2b, 2b, as shown in FIG. 8, may be provided to be cross-shaped when seen in plan view, in the region of points of intersection between vertical and horizontal gaps 9a, 9a.

In the present embodiment, cross-shaped ribs 2b, 2b may be formed simultaneously when the film 2a is formed in the corners of the gap 9a between the films 2a, 2a. This enables the achievement of the effect of being able to maintain stress relaxation, while increasing the rigidity of the metal member 3. The lengths of the ribs 2b, 2b may be established to within a range that does not hinder stress relaxation, and within the range from 0.1 to 1 times the length dimension of the gaps 9a, 9a. An arbitrary shape that does not hinder stress relaxation may be formed in the divided films 2a, 2a inside gaps 9a, 9a, and shapes are possible as a plurality of split apart ribs 2b, 2b, or the ribs only extending to bridge across a plurality of aperture patterns 4.

Experimental Example 1

As an experimental example of one aspect of the present invention, a deposition mask corresponding to the above-described first embodiment was manufactured, the specifications noted below were set, and deposition processing was performed.

The polyimide layer (film) apertures were formed using a laser.
A gap for each organic EL panel disposed in the mask plane was provided in the polyimide film (PI), and each panel was cut apart.
The size of a one continuous polyimide layer was made 50 mm×80 mm.
The size of the substrate was made 320 mm×400 mm.
The size of one panel was made 40 mm×70 mm.
The direction of the short side of the substrate was taken as the direction of arrangement of the R, G, and B pixels.
Invar having an equivalent coefficient of thermal expansion of 1 ppm was used.
Polyimide having an equivalent coefficient of thermal expansion of 30 ppm was used.
A point deposition source was used.
The film forming conditions were set as follows.
Film growth rate:

| Host material | 2 Ångstoms/s |
| Dopant 1 material | 0.3 Ångstroms/s |
| Assist material | 1 Ångstroms/s |
| Film thickness: | 300 Ångstroms |

The amount of thermal elongation in the plane of a 300 mm×400 mm substrate before providing the gap in the polyimide layer is 76.8 µm in the substrate short-side direction and 96 µm in the substrate long-side direction.
The amount of thermal elongation of the polyimide layer in a mask of one aspect of the present invention that was provided with a gap within the plane of a 50 mm×80 mm panel is 12 µm in the substrate short-side direction and 19.2 µm in the substrate long-side direction.
The amount of thermal elongation of the Invar layer in the plane of the substrate was 2.6 µm in the substrate short-side direction and 3.2 µm in the substrate long-side direction, and in the plane of the panel was 0.4 µm in the short-side direction and 0.6 µm in the long-side direction.
In contrast to a structure in which a gap was not provided in the polyimide layer, with which the difference in length between the polyimide and Invar reaches 96.4 µm, with a structure of one aspect of the present invention in which a gap was provided, the value becomes a very small 18.8 µm.
In addition to a dramatic reduction in the stress that occurs, because the stress occurring is concentrated in the gap part of the polyimide layer, where there is no polyimide and strength is low, even if mask floating occurs because of thermal elongation, because it occurs between panels, wherein there is no aperture pattern, the effect is extremely small.
The mask temperature rise was 8° C.

Experimental Example 2

As an experimental example of an aspect of the present invention, a deposition mask corresponding to the above-described second embodiment was manufactured, the specifications noted below were set, and deposition processing was performed.

Figure 4:
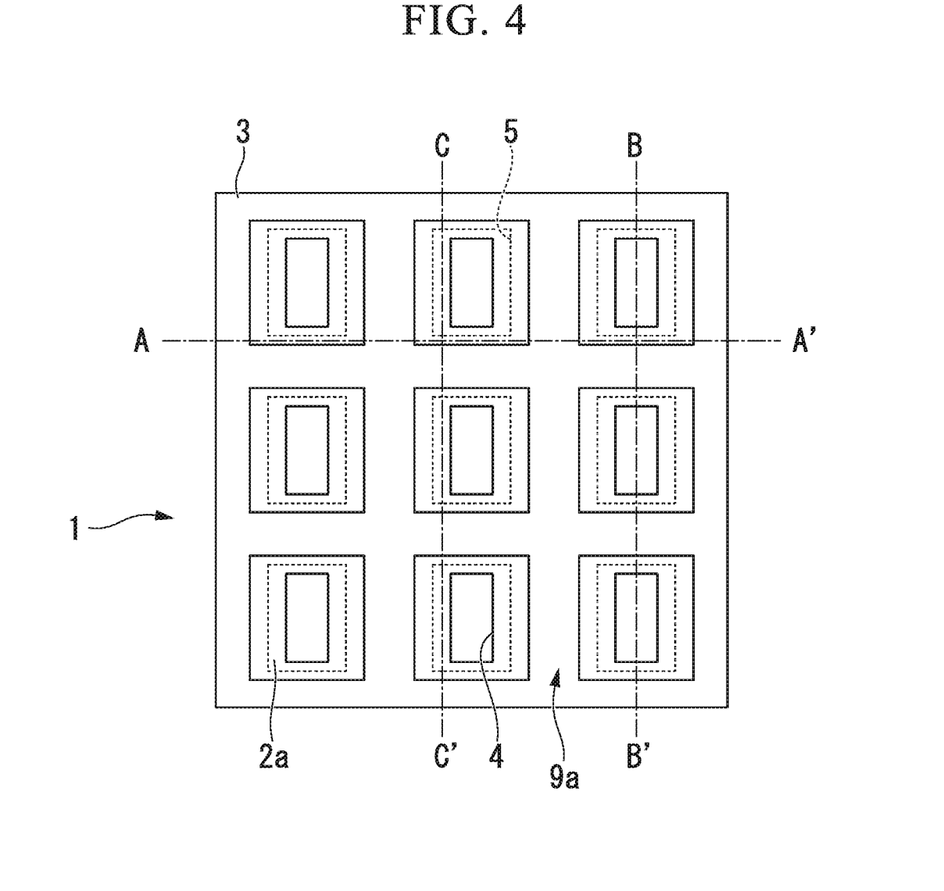
FIG. 4 is a plan view showing an experimental example in a deposition mask according to one aspect of the present invention.

FIG. 4 is a plan view showing the surface on the polyimide layer (film) 2 side in the deposition mask in the present embodiment, FIG. 5A to FIG. 5D being the cross-sectional view along the line A-A' in FIG. 4 (FIG. 5A), the cross-sectional view along the line B-B' in FIG. 4 (FIG. 5B), the cross-sectional view along the line C-C' in FIG. 4 (FIG. 5C), and the cross-sectional view along the line D-D' in FIG. 4 (FIG. 5D) during deposition.

The apertures 5 of the Invar layer 3, as shown in FIG. 4 and FIG. 5A to FIG. 5D, were disposed to be larger than the apertures 4 of the polyimide layer 2a.
The apertures of the polyimide layer were smaller than the apertures in the Invar layer, and were of a shape corresponding to the desired film formation pattern.
The apertures of the polyimide layer were formed by a laser.
The structure was such that a gap was provided in the polyimide layer for each panel disposed in the plane of the mask and cut apart for each aperture of the Invar.
The size of a one continuous polyimide layer was made 0.43 mm×0.43 mm.
The size of the substrate was made 730 mm×920 mm.
The size of one panel was made 650 mm×850 mm.
The direct of the short side of the substrate was taken as the direction of arrangement of the R. G, and B pixels.
Invar having an equivalent coefficient of thermal expansion of 1 ppm was used.
Polyimide having an equivalent coefficient of thermal expansion of 30 ppm was used.
A line deposition source was used.
The film forming conditions were set as follows.
Film growth rate:

| Host material | 2 Ångstoms/s |
| Dopant 1 material | 0.3 Ångstroms/s |
| Assist material | 1 Ångstroms/s |
| Film thickness: | 300 Ångstroms |

Experimental Example 3

A deposition mask in which gaps are not provided in the polyimide layer was manufactured and compared.
FIG. 6 and FIG. 7A to FIG. 7D correspond to FIG. 4 and FIG. 5A to FIG. 5D, FIG. 6 being a plan view showing a plan view showing the surface on the polyimide layer (film) 2 side in the deposition mask in the present embodiment, in which gaps are not provided, FIG. 7A to FIG. 7D being the cross-sectional view along the line A-A' in FIG. 6 (FIG. 7A), the cross-sectional view along the line B-B' in FIG. 6 (FIG. 7B), the cross-sectional view along the line C-C' in FIG. 6 (FIG. 7C), and the cross-sectional view along the line A-A' in FIG. 6 (FIG. 7D) during deposition.
The following situation was understood from the above-noted results.

Figure 5A:
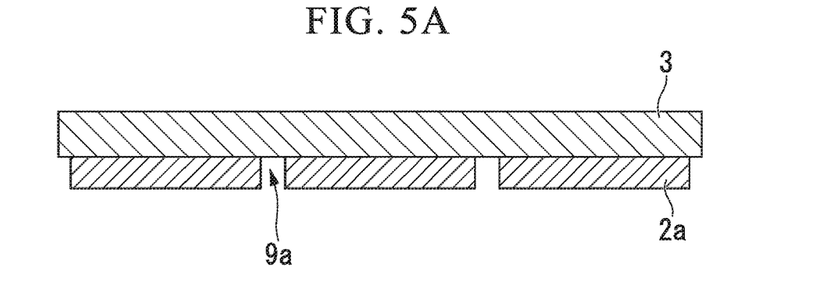
FIG. 5A is a cross-sectional view along the line A-A' in FIG. 4.
Figure 5B:
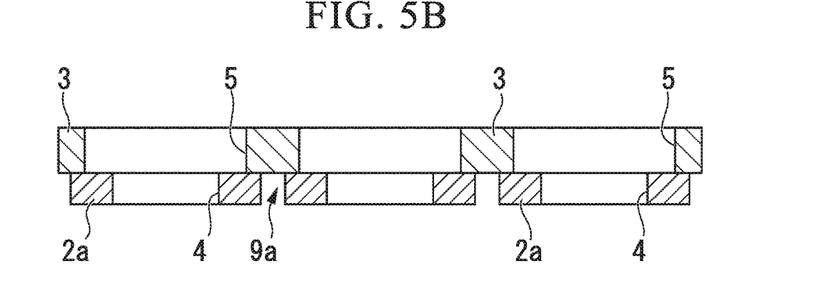
FIG. 5B is a cross-sectional view along the line B-B' in FIG. 4.
Figure 5C:
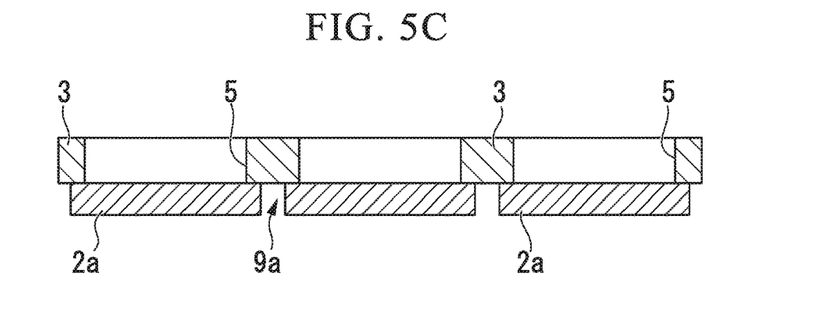
FIG. 5C is a cross-sectional view along the line C-C' in FIG. 4.
Figure 5D:
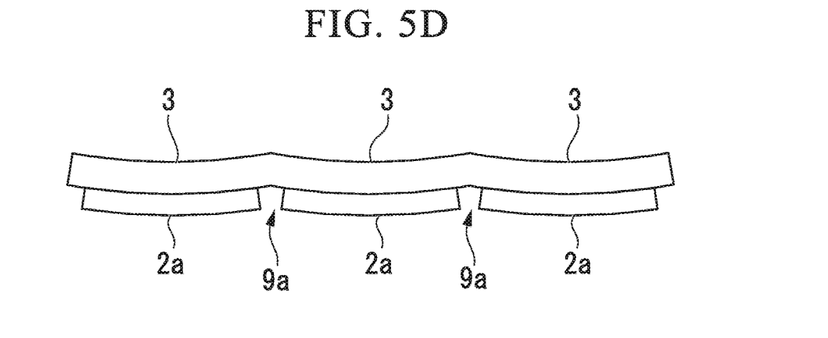
FIG. 5D is a schematic cross-sectional view during deposition processing in the cross-sectional view along the line A-A' in FIG. 4.
Figure 6:
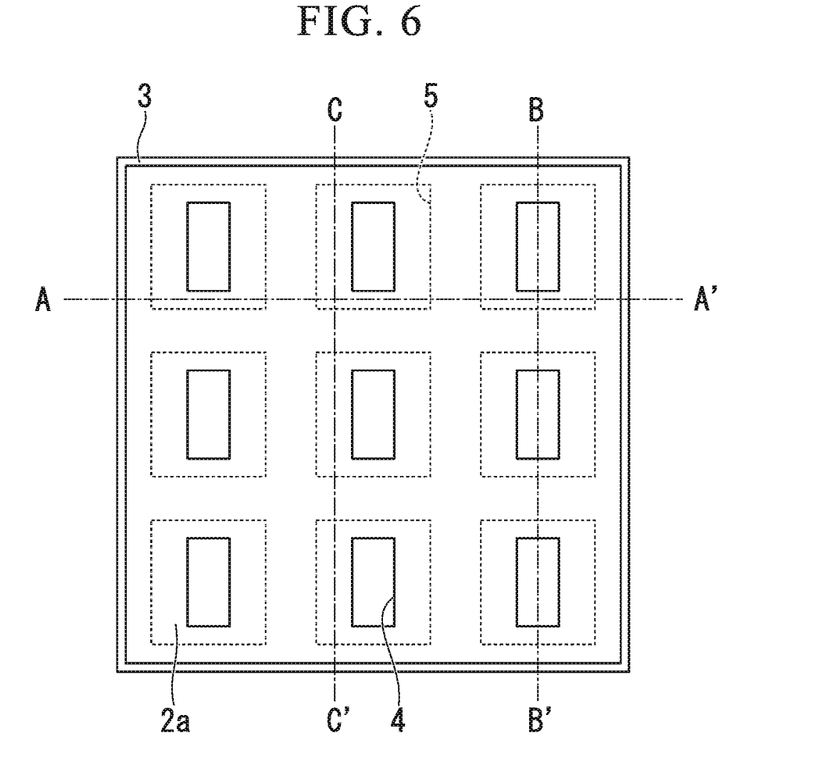
FIG. 6 is a plan view showing a deposition mask in the condition in which gaps are not provided in the PI layer.
Figure 7A:
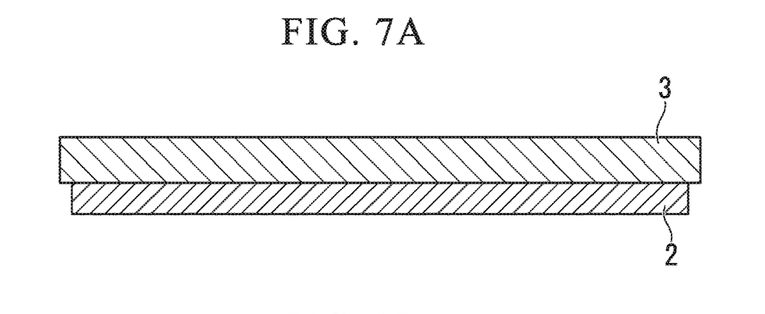
FIG. 7A is a cross-sectional view along the line A-A' in FIG. 6.
Figure 7B:
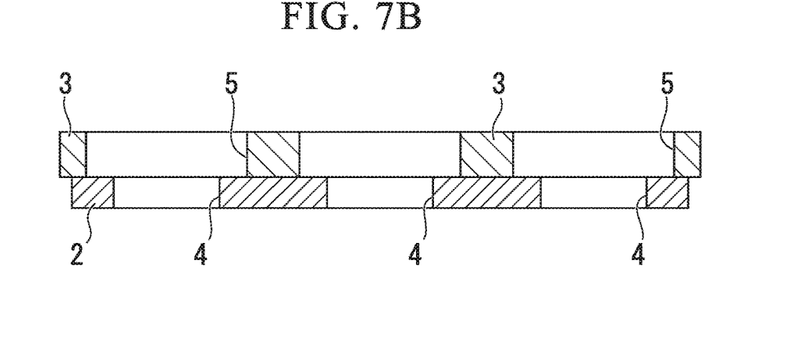
FIG. 7B is a cross-sectional view along the line B-B' in FIG. 6.
Figure 7C:
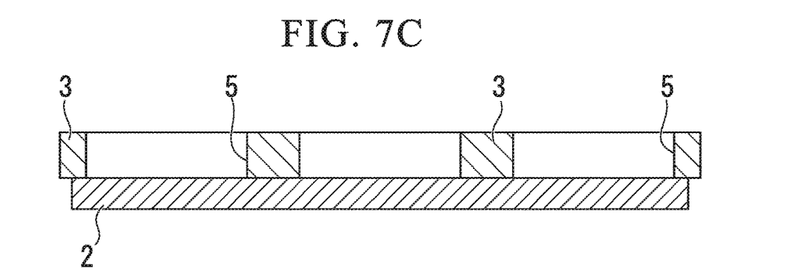
FIG. 7C is a cross-sectional view along the line C-C' in FIG. 6.
Figure 7D:
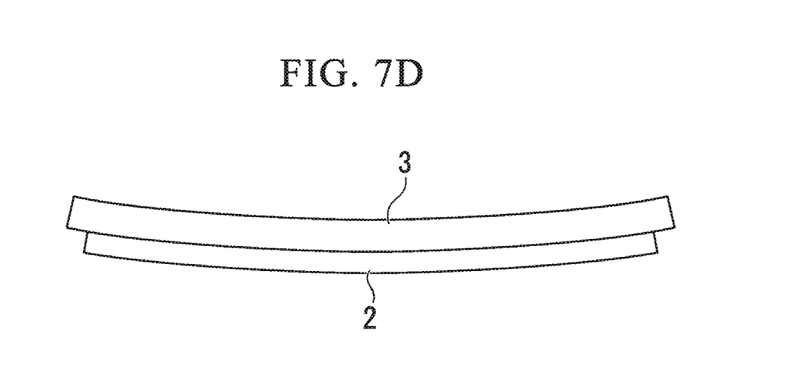
FIG. 7D is a schematic cross-sectional view during deposition processing in the cross-sectional view along the line A-A' in FIG. 6.

In the example shown in FIG. 6 and FIG. 7A to FIG. 7D, the difference in the rates of thermal expansion affected the entire mask, over which there was sagging, as shown in FIG. 7D. In this example, the coefficient of thermal expansion of polyimide is higher than the coefficient of thermal expansion of Invar and also, because of joining along a straight line, the mask sagging becomes large. In contrast, in the present embodiment, as shown in FIG. 5D, the difference in the thermal expansion rates affects the individual divided polyimide layers, which sag. By dividing the polyimide, because the surface area of the polyimide itself is made smaller and also the stress is relaxed by the gaps, each single sag can be suppressed to be small. For that reason, the overall thermal elongation amount is reduced, specifically as follows.

The amount of thermal elongation in the plane of a 730 mm×920 mm substrate before providing the gap in the polyimide layer is 262.8 μm in the substrate short-side direction and 331.2 μm in the substrate long-side direction.

The amount of thermal elongation in the polyimide layer in a mask of one aspect of the present invention that was provided with a gap within a region of one aperture of 0.43 mm×0.43 mm of polyimide is 0.129 μm in both the short-side direction and the long-side direction of the substrate.

The amount of thermal elongation of the Invar layer in the plane of the substrate was 8.76 μm in the substrate short-side direction and 11.04 μm in the substrate long-side direction, and in one aperture region was 0.0043 μm in both the short-side direction and the long-side direction.

In contrast to a structure in which a gap was not provided in the polyimide layer, in which the difference in length between the polyimide and Invar reaches 320.16 μm, with a structure of one aspect of the present invention in which a gap was provided, the value becomes a very small 0.1247 μm.

The mask temperature rise was 12° C.

From these results, it is understood that, a deposition mask of an aspect of the present invention, eliminates the sagging and waviness caused by the difference in coefficients of thermal expansion for each layer, and performs control so that the difference in expansions within the substrate plane does not accumulate over a certain value, thereby preventing positional offset and eliminating pattern separation, enabling formation of very fine patterns with good productivity.

INDUSTRIAL APPLICABILITY

Although there is no particular restriction of the field of use of a deposition mask and manufacturing method of a number of aspects of the present invention, they are preferably used in the formation of light-emitting layers of organic EL display devices.

DESCRIPTION OF THE REFERENCE SYMBOLS

1 Deposition mask
2 Film
2A, 2B, 2a Divided film
2b Rib (film)
3 Metal member
4 Aperture pattern
5 Through aperture
8 Substrate
8a Thin-film pattern
9, 9a Gap

The invention claimed is:

1. A deposition mask comprising a plurality of layers, the deposition mask being for forming of a thin-film pattern of a certain shape on a substrate by deposition, the deposition mask comprising:

a film in which an aperture pattern is formed, the aperture pattern passing through the film, the aperture being with a shape and dimension corresponding to the thin-film pattern in a pre-established region for formation of the thin-film pattern on the substrate; and a metal member that has an aperture part opposite the aperture pattern with a shape and dimension larger than the aperture pattern, the metal member being provided as a thin sheet in direct contact with one surface of the film on an outside part of the aperture pattern of the film, wherein the film is, for the metal member, mutually distanced and distributed into a plurality of divided parts on one surface of the metal member, wherein a rib is formed between the plurality of divided parts on the metal member.

2. The deposition mask according to claim 1, wherein a gap separating between the film divided extends an entire length of the metal member in a width direction.

3. The deposition mask according to claim 1, wherein a gap separating between the film divided extends an entire length of the metal member in a vertical direction orthogonal to a width direction.

4. The deposition mask according to claim 1, wherein the film is multiply divided in correspondence to regions in which the plurality of thin-film patterns are formed as a group.

5. The deposition mask according to claim 1, wherein the film is multiply divided for each region for forming the thin-film patterns.

6. The deposition mask according to claim 1, wherein the substrate is a TFT substrate for an organic EL display and
wherein the thin-film pattern has organic EL layers for three colors.

7. The deposition mask according to claim 1, wherein in a gap between the film divided, a second film separated from the film divided is provided.

8. A manufacturing method for a deposition mask comprising a plurality of layers, the deposition mask being for forming of a thin-film pattern of a certain shape on a substrate by deposition, the deposition mask comprising a film in which an aperture pattern is formed, the aperture pattern passing through the film, the aperture being with a shape and dimensions corresponding to the thin-film pattern in a pre-established region for formation of the thin-film pattern on the substrate, and a metal member that has an aperture part opposite the aperture pattern with a shape and dimension larger than the aperture pattern, the metal member being provided as a thin sheet in direct contact with one surface of the film on an outside part of the aperture pattern of the film, wherein the film, for the metal member, is mutually distanced and distributed into a plurality of divided parts on one surface of the metal member, the manufacturing method comprising:

forming on a surface of a metal sheet to serve as the metal member a resin layer to serve as the film;

forming a plurality of the aperture parts that pass through the metal sheet; and forming on the resin layer aperture patterns having shapes and dimensions smaller than the aperture parts and forming a separated film multiply and divided by removal of the resin layer so as to mutually distance and distribute them on one surface of the metal member.

9. The manufacturing method for the deposition mask according to claim 8,
wherein the formation of the aperture parts in the metal member is done from a surface of the metal sheet on a side opposite from the resin layer.

10. The manufacturing method for the deposition mask according to claim 8,
wherein the formation of the aperture pattern in the resin layer is done from a surface of the metal sheet on the resin layer side.

11. The manufacturing method for the deposition mask according to claim 10,
wherein forming of the aperture pattern and the forming of the separated film are performed using laser light radiation.

12. The deposition mask according to claim 1,
wherein a rib is formed in a corner of a gap between the plurality of divided parts on the metal member, and a shape of the rib is cross-shaped.

13. The manufacturing method for the deposition mask according to claim 8, further comprising:
simultaneously forming a rib on the metal member when the separated film is formed.

14. A deposition method comprising:
performing a deposition by using a deposition mask,
wherein the deposition mask comprises a plurality of layers, the deposition mask being for forming of a thin-film pattern of a certain shape on a substrate by the deposition, the deposition mask comprising
a film in which an aperture pattern is formed, the aperture pattern passing through the film, the aperture being with a shape and dimensions corresponding to the thin-film pattern in a pre-established region for formation of the thin-film pattern on the substrate, and
a metal member that has an aperture part opposite the aperture pattern with a shape and dimension larger than the aperture pattern, the metal member being provided as a thin sheet in direct contact with one surface of the film on an outside part of the aperture pattern of the film, and
wherein the film is mutually distanced and distributed into a plurality of divided parts on one surface of the metal member, wherein a rib is formed between the plurality of divided parts on the metal member.

* * * * *